(12) United States Patent
Mimis et al.

(10) Patent No.: US 10,027,288 B2
(45) Date of Patent: Jul. 17, 2018

(54) AMPLIFIER

(71) Applicant: KABUSHIKI KAISHA TOSHIBA, Minato-ku (JP)

(72) Inventors: Konstantinos Mimis, Bristol (GB); Gavin Watkins, Bristol (GB)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/032,132

(22) PCT Filed: Oct. 28, 2013

(86) PCT No.: PCT/GB2013/052811
§ 371 (c)(1),
(2) Date: Apr. 26, 2016

(87) PCT Pub. No.: WO2015/063434
PCT Pub. Date: May 7, 2015

(65) Prior Publication Data
US 2016/0268979 A1 Sep. 15, 2016

(51) Int. Cl.
*H03F 1/56* (2006.01)
*H03F 3/193* (2006.01)
*H03F 1/02* (2006.01)
*H03F 3/189* (2006.01)
*H03G 3/30* (2006.01)

(52) U.S. Cl.
CPC ............. *H03F 1/56* (2013.01); *H03F 1/0211* (2013.01); *H03F 1/0261* (2013.01); *H03F 3/189* (2013.01); *H03F 3/193* (2013.01); *H03F 2200/165* (2013.01); *H03F 2200/18* (2013.01); *H03F 2200/451* (2013.01); *H03G 3/3036* (2013.01)

(58) Field of Classification Search
USPC .......................... 330/305, 302, 285, 296, 136
See application file for complete search history.

(56) References Cited

U.S. PATENT DOCUMENTS

| 6,349,216 | B1 | 2/2002 | Alberth, Jr. et al. |
| 6,449,465 | B1 | 9/2002 | Gailus et al. |
| 6,710,646 | B1 | 3/2004 | Kimball |
| 8,319,549 | B2 * | 11/2012 | Sengupta .............. H03F 1/0266 330/124 R |
| 9,294,056 | B2 * | 3/2016 | Nobbe .................. H03F 1/0261 |

(Continued)

FOREIGN PATENT DOCUMENTS

| GB | 2 356 093 A | 5/2001 |
| WO | WO 01/47127 A1 | 6/2001 |

OTHER PUBLICATIONS

International Search Report and Written Opinion dated Sep. 10, 2014 in PCT/GB2013/052811.

(Continued)

*Primary Examiner* — Hieu Nguyen
(74) *Attorney, Agent, or Firm* — Oblon, McClelland, Maier & Neustadt, L.L.P.

(57) ABSTRACT

In an embodiment an amplifier circuit comprises an amplifying element configured to amplify a radiofrequency input signal; a bias modulator configured to provide a bias voltage to the amplifying element, the bias voltage depending on a bias control signal; and a tuneable matching network configured to modulate the load to which the output of the amplifying element is applied.

7 Claims, 12 Drawing Sheets

(56) References Cited

U.S. PATENT DOCUMENTS

| | | |
|---|---|---|
| 2004/0075494 A1 | 4/2004 | Klomsdorf et al. |
| 2004/0207468 A1 | 10/2004 | Klomsdorf et al. |
| 2006/0028271 A1 | 2/2006 | Wilson |
| 2006/0145758 A1 | 7/2006 | Klomsdorf et al. |
| 2010/0060357 A1 | 3/2010 | Drogi et al. |

OTHER PUBLICATIONS

Hyeong Tae et al: "Efficiency Enhancement Method for High-Power Amplifiers using a Dynamic Load Adaptation Technique", 2005 IEE MTT-S International microwave symposium. XP10844970A, Jun. 12, 2005, pp. 2059-2062.

Raab, Frederick H., "Split-Band Modulator for Kahn-Technique Transmitters", 2004 IEEE MTT S Digest.

Kato, et al., "Performance of a Frequency Compensated EER-PA with Memoryless DPD", Proceedings of Asia-Pacific Microwave Conference 2010.

\* cited by examiner ns and in particular to dynamic load modulation.

AMPLIFIER

FIELD

Embodiments described herein relate generally to amplifiers and in particular to dynamic load modulation.

BACKGROUND

Load modulation is an efficiency and linearity enhancement technique which can be subdivided into two major categories: Doherty architectures and dynamic load modulation (DLM). Doherty architectures are based on active load modulation. Dynamic load modulation is based on tuneable components. The Doherty architectures approach suffers from several drawbacks, such as the need for at least two transistor devices with appropriate size ratios, limited RF bandwidth and losses in the combination/impedance inversion circuit. DLM as an alternative technology uses tuneable passive or active components to modulate the amplifier load appropriately.

The efficiency of an amplifier is given by the following equation:

$$\eta = \frac{i_{rms}^2 R_L}{i_{dc} V_{dc}} \quad (1)$$

Where $i_{rms}$ is the drain current of the transistor, $R_L$ is the real part of the output impedance termination, $i_{dc}$ and $V_{dc}$ are the DC current and voltage supply, respectively. For a given $i_{rms}$ and DC supply, $R_L$ is chosen such that efficiency is optimised. This leads to suboptimal operation for any other value of $i_{rms}$ i.e. under back-off away from peak power. From (1) it follows that by varying $V_{dc}$ or $R_L$, efficiency can be sustained for any output power level. Varying $V_{dc}$ leads to dynamic supply modulation (for example envelope tracking or envelope elimination and restoration) while varying $R_L$ leads to load modulation (Doherty or DLM). As discussed above, DLM is favourable compared to Doherty architectures.

BRIEF DESCRIPTION OF THE DRAWINGS

In the following, embodiments will be described as non-limiting examples with reference to the drawings in which.

DETAILED DESCRIPTION

According to an embodiment, amplifier circuit comprises an amplifying element configured to amplify a radiofrequency input signal; a bias modulator configured to provide a bias voltage to the amplifying element, the bias voltage depending on a bias control signal; and a tuneable matching network configured to modulate the load to which the output of the amplifying element is applied.

In an embodiment the tuneable matching network is configured to modulate the reactance of the load.

In an embodiment the tuneable matching network comprises a single reactive element.

In an embodiment the bias modulator is configured to adjust the conduction angle of the amplifying element in response to changes in an envelope signal of the radiofrequency input signal.

In an embodiment the bias modulator is configured to control the effective class of operation of the amplifying element in dependence on an envelope signal of the radiofrequency input signal.

In an embodiment the bias modulator comprises a switch configured to select the bias voltage from a plurality of discrete voltages.

In an embodiment the bias modulator is configured to process an envelope signal of the radiofrequency input signal and control the bias voltage according to the processed envelope signal.

In an embodiment the bias modulator comprises a variable gain amplifier configured to amplify the envelope signal. In an embodiment the bias modulator further comprises a low pass filter.

In an embodiment the amplifying element comprises a transistor.

In an embodiment the bias control signal depends on an envelope signal of the radiofrequency input signal.

In an embodiment the bias control signal has a modulation rate of between 1/10 and 1/4 of the modulation rate of an envelope signal of the ratiofrequency input signal.

Figure 1:
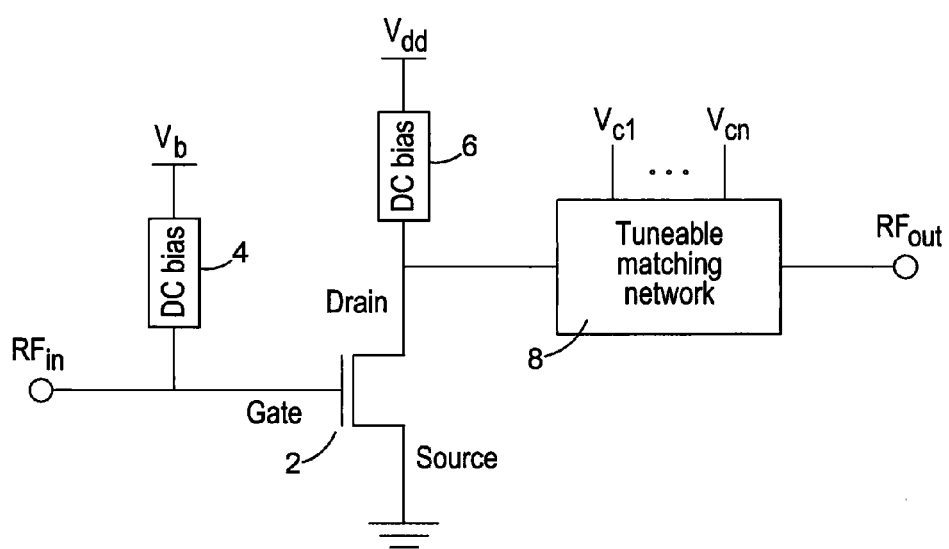
FIG. 1 shows an amplifier circuit with dynamic load modulation.

FIG. 1 shows an amplifier circuit with dynamic load modulation (DLM). A transistor 2 is arranged as an amplifying element to amplify a radiofrequency input signal $RF_{in}$. The radiofrequency input signal $RF_{in}$ is applied to the gate terminal of the transistor 2. A fixed bias voltage $V_b$ is applied to the gate of the transistor 2 through a DC bias network 4. The source terminal of the transistor is connected to ground. The drain terminal of the transistor is connected to a tuneable matching network 8. A supply voltage $V_{dd}$ is coupled to the drain terminal through a DC bias network 6. The output $RF_{out}$ of the tuneable matching network 8 is applied to a load.

Figure 2:
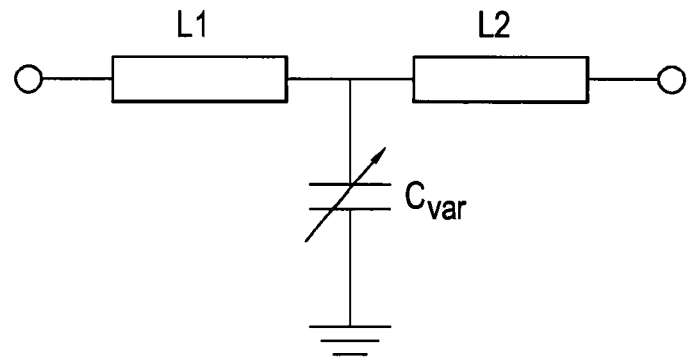
FIGS. 2 to 4 show tuneable matching networks.
Figure 3:
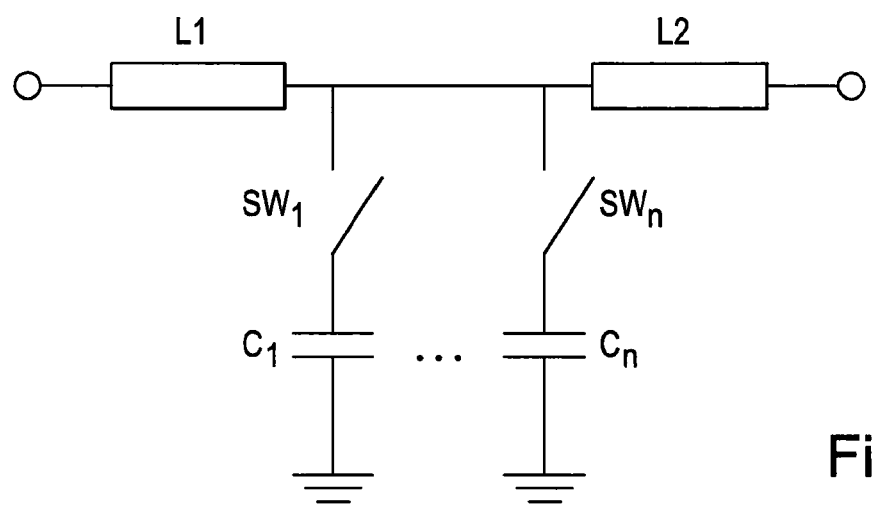
Figure 4:
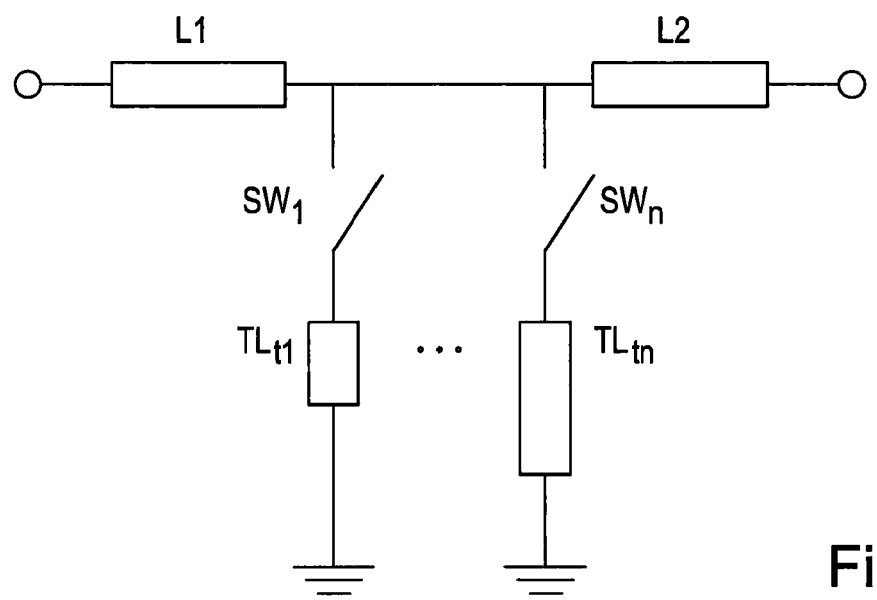

FIGS. 2, 3 and 4 show possible realisations of the tuneable matching network. The tuneable networks can be realised in various ways and may consist of combinations of sub-networks like the ones shown in FIG. 2, FIG. 3 and FIG. 4.

FIG. 2 shows a network comprising two inductors and a variable capacitor. A first inductor L1 and a second inductor L2 are connected in series. The variable capacitor $C_{var}$ is connected between ground and a point between the first inductor L1 and the second inductor L2. The tuneable capacitor may be implemented as a varactor.

FIG. 3 shows a network comprising a plurality of capacitors which can be selectively connected using switches. A first inductor L1 and a second inductor Ln are connected in series. The plurality of capacitors $C_1 \ldots C_n$ can be selectively connected between ground and a point between the first inductor L1 and the second inductor Ln by switches $SW_1 \ldots SW_n$.

FIG. 4 shows a network comprising a plurality of inductors which can be selectively connected using switches. A first inductor L1 and a second inductor Ln are connected in series. The plurality of inductors $TL_{t1} \ldots TL_{tm}$ can be selectively connected between ground and a point between the first inductor L1 and the second inductor Ln by switches $SW_1 \ldots SW_n$.

The switches may be implemented as field effect transistors (FETs), micro-electromechanical systems (MEMS) devices or pin diodes.

By controlling the state of the tuneable elements at the envelope rate, the impedance presented by the tuneable matching network to the transistor device is controlled and optimised to achieve highly efficient operation or improve linearity over the whole dynamic range of the signal.

Figure 5:
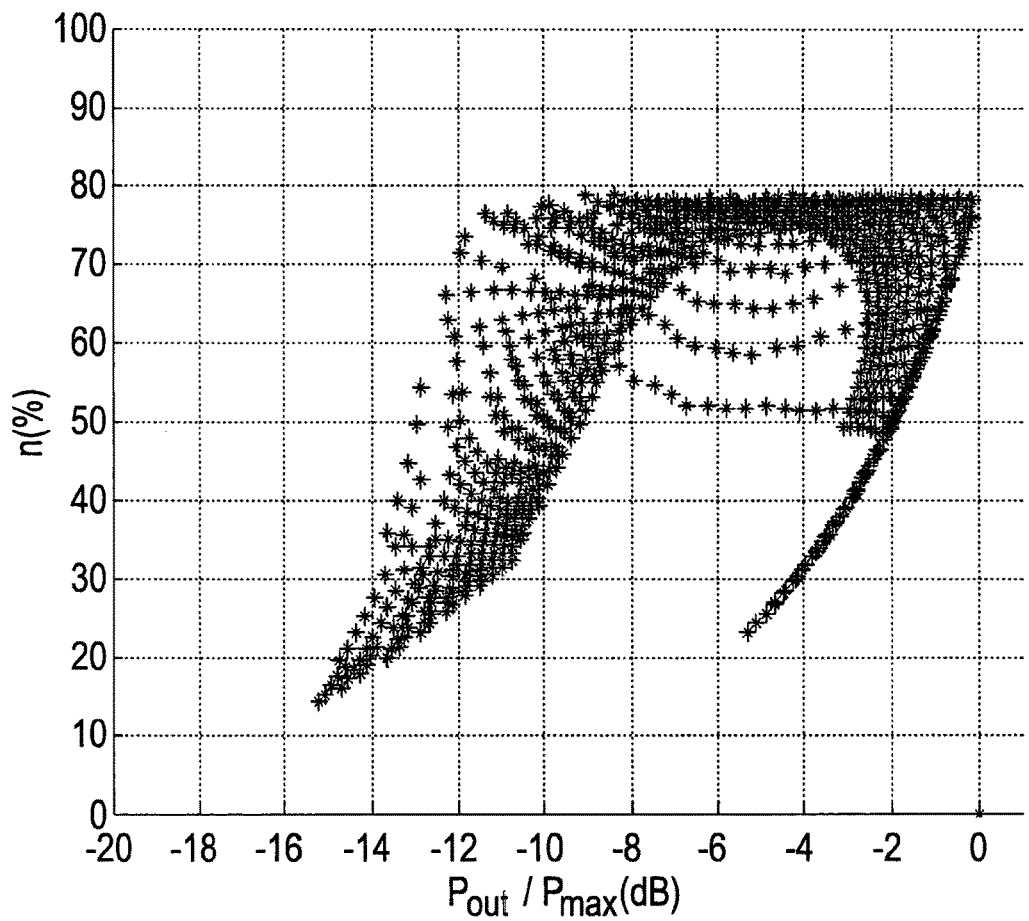
FIGS. 5 and 6 show plots of efficiency against output power for the amplifier circuit shown in FIG. 1 with both resistive and reactive load control.
Figure 6:
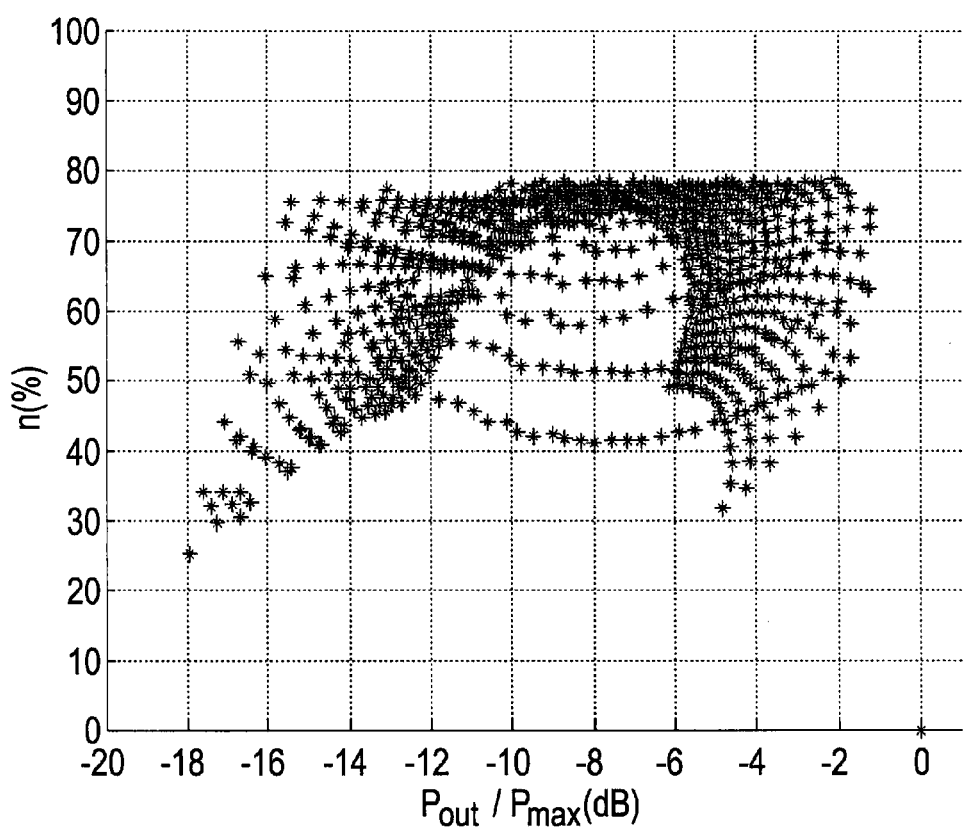

FIGS. 5 and 6 show plots of efficiency (n) against output power ($P_{out}/P_{max}$ (dB)) for the amplifier circuit shown in FIG. 1 with both resistive and reactive load control for different ratios of transistor output reactance ($X_{Cds}$) and load-line ($R_L$). These are device and technology dependent parameters. The results presented in the figures are described below in relation to the quantities $X_{Cds}$ $R_L$ and $X_L$ which are defined as follows. $X_{Cds}$ is the reactance of the stray output capacitance of the transistor device, $R_L$ is the real part of the output impedance termination as in (1) and $X_L$ its reactance. Consequently the output termination is $Z_L=R_L+jX_L$. The importance of the ratio of $X_{Cds}/R_L$ is that is independent of transistor size but rather reflects transistor technology and frequency of operation.

FIG. 5 shows efficiency results under DLM with resistive ($R_L$=0.3 to 1) and reactive ($X_L$=0 to 3) control with the device under Class-B operation, case 1 ($X_{Cds}/R_{opt}$=2).

FIG. 6 shows efficiency results under DLM with resistive ($R_L$=0.5 to 2) and reactive ($X_L$=0 to 5) control with the device under Class-B operation, case 2 ($X_{Cds}/R_{opt}$=4).

Figure 7:
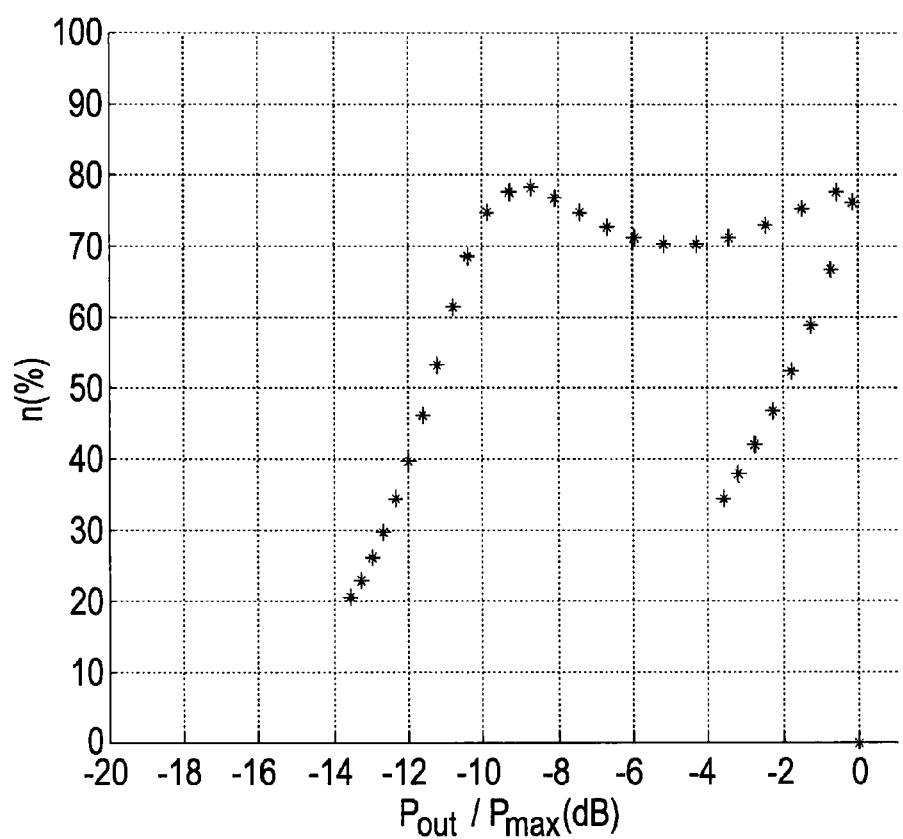
FIGS. 7 and 8 show plots of efficiency against output power for the amplifier circuit shown in FIG. 1 with reactive load control.
Figure 8:
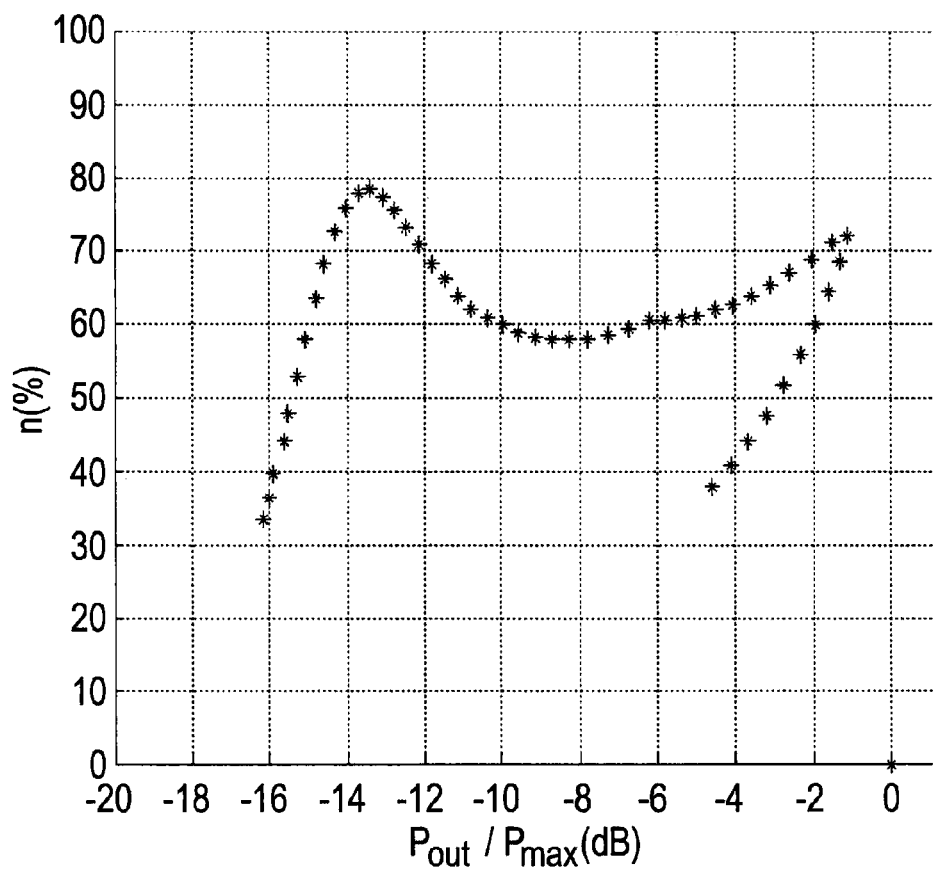

High efficiency may be achieved with only reactive tuning of the load. An advantage of this is that the losses over the tuneable matching network are low. FIGS. 7 and 8 show plots of efficiency (n) against output power ($P_{out}/P_{max}$ (dB)) for the amplifier circuit shown in FIG. 1 with only reactive load control for different ratios of transistor output reactance ($X_{Cds}$) and load-line ($R_L$).

FIG. 7 shows efficiency results under DLM with reactive ($X_L$=0 to 3, $R_L$=0.46) control, case 1 ($X_{Cds}/R_{opt}$=2).

FIG. 8 shows efficiency results under DLM with reactive ($X_L$=0 to 5, $R_L$=0.68) control, case 2 ($X_{Cds}/R_{opt}$=4).

Figure 9:
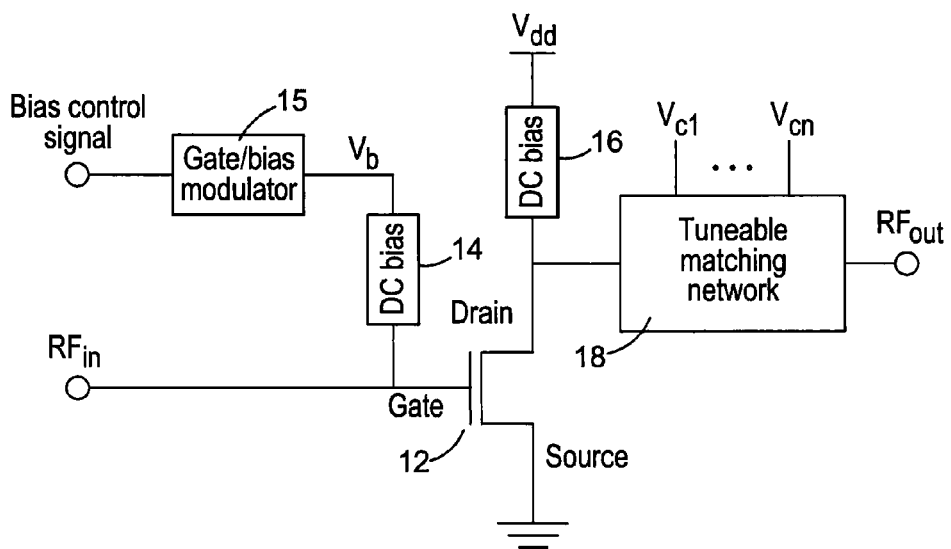
FIG. 9 shows an amplifier circuit according to an embodiment.

FIG. 9 shows an amplifier circuit according to an embodiment. The amplifier circuit comprises a transistor 12 arranged as an amplifying element to amplify a radiofrequency input signal $RF_{in}$. The radiofrequency input signal $RF_{in}$ is applied to the gate terminal of the transistor 12. The source terminal of the transistor is connected to ground. The drain terminal of the transistor is connected to a tuneable matching network 18. The tuneable matching network 18 provides the appropriate fundamental and harmonic terminations to the transistor for each input signal level. A supply voltage $V_{dd}$ is coupled to the drain terminal through a DC bias network 16. The output $RF_{out}$ of the tuneable matching network 18 is applied to a load.

In an embodiment, the signals Vc1,n are analogue signals generated at the baseband based on the RF signal's envelope using pre-defined look up tables. The look up tables may be updated through some feedback mechanism.

In an alternative embodiment the signals Vc1,n are digital control signals generated using pre-defined look up tables, switching between different voltage control levels applied to the TMN.

A bias modulator 15 modulates a bias voltage $V_b$ applied to the gate of the transistor 12. The bias modulator 15 provides a variable voltage level $V_b$ to the gate of the transistor 12 in order to control the bias of the transistor 12. This adjusts the conduction angle of the transistor 12. By adjusting the conduction angle of the transistor 12, the effective class of operation of the transistor 12 can be controlled and changed. $V_b$ is controlled in accordance with a bias control signal and the termination provided by the tuneable matching network 18.

In an embodiment the bias control signal is dependent upon the envelope signal of the input signal.

Dynamically controlling the bias of the amplifier can boost efficiency at the output power back-off region by operating the amplifier under a reduced conduction angle. Moreover, it can achieve higher power utilisation factor (PUF), meaning higher peak output power for a given resistive output impedance termination by increasing the conduction angle. This can be seen in FIG. 10 and FIG. 11.

Figure 10:
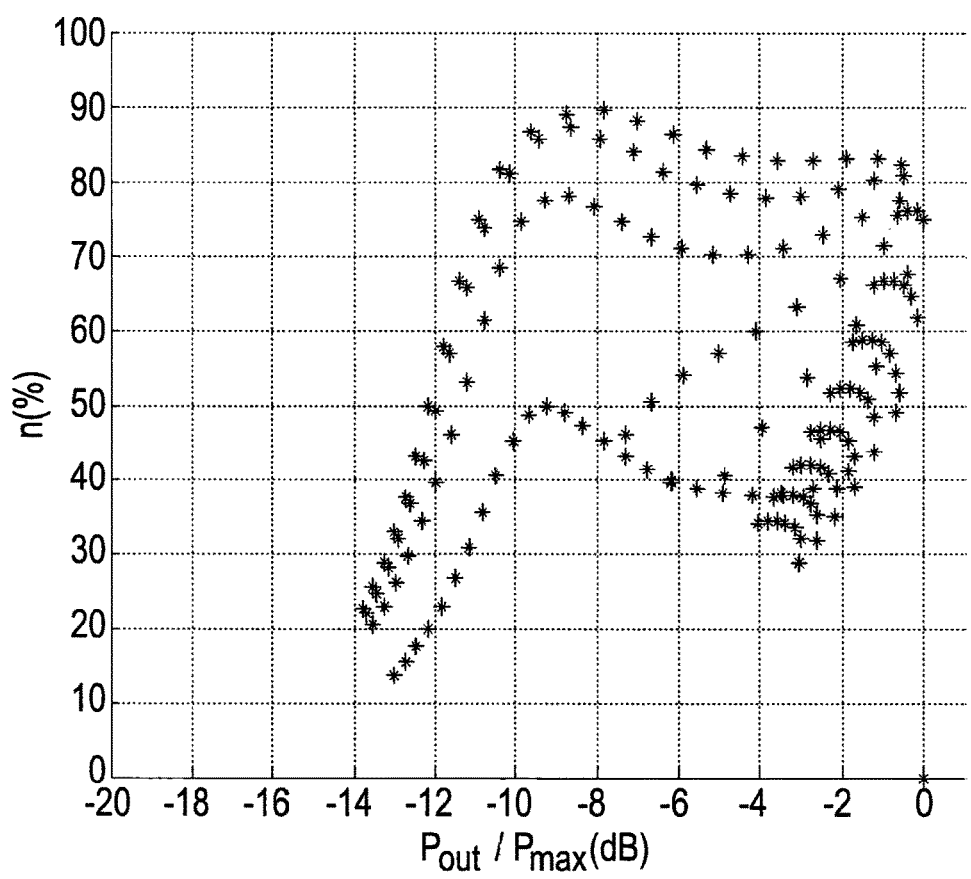
FIGS. 10 and 11 show efficiency results of the circuit shown in FIG. 9.

FIG. 10 shows efficiency results under DLM with dynamic bias and reactive ($X_L$=0 to 3, $R_L$=0.46) tuning, case 1 ($X_{Cds}/R_{opt}$=2).

Figure 11:
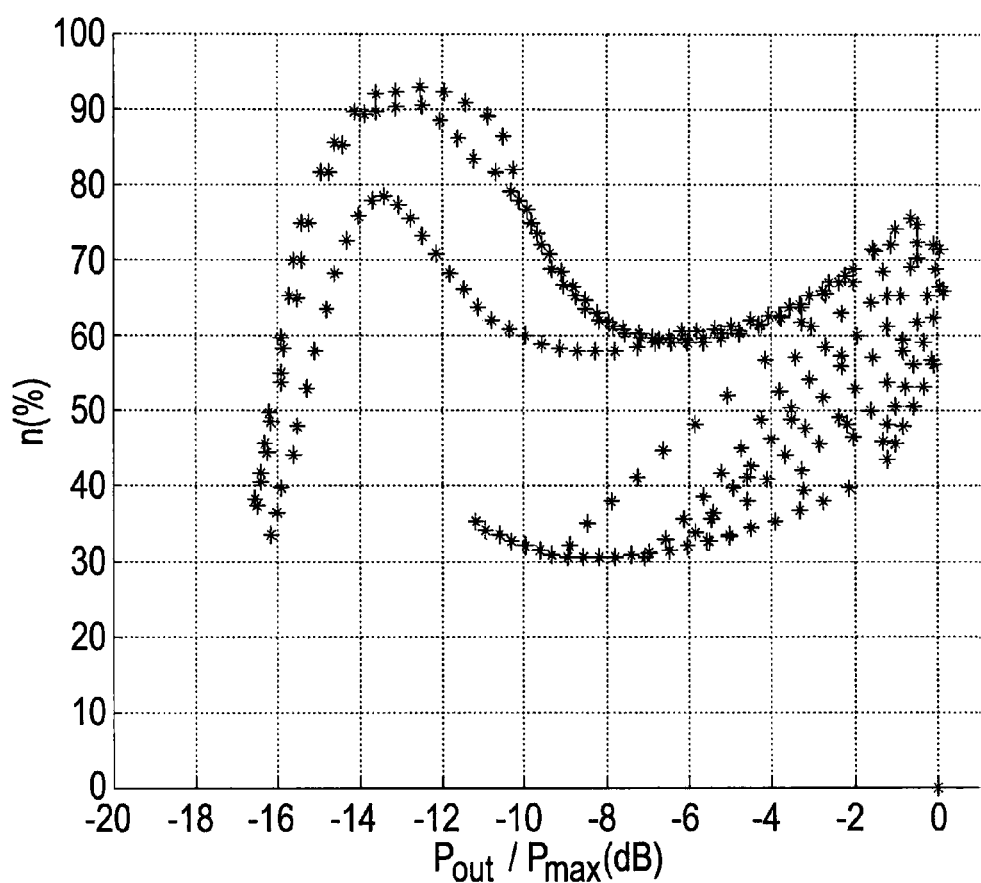

FIG. 11 shows efficiency results under DLM with dynamic bias and reactive ($X_L$=0 to 5, $R_L$=0.68) tuning, case 2 ($X_{Cds}/R_{opt}$=4).

In an embodiment, the drain voltage $V_{dd}$ is modulated. This may be implemented in one of two possible ways:

In an embodiment supply modulation is the main technique used and load-modulation the complementary (e.g. to provide output power control) and so Vdd is modulated to follow the envelope signal while the TMN is controlled in discrete levels not related to the envelope.

In an alternative embodiment load modulation is the main technique and supply modulation the complementary one and so Vdd modulation does not follow the envelope but is rather controlled to modify the output power level of the system.

In an embodiment a matching network with a single reactive tuneable element such as the one shown in FIG. 2 is used for the tuneable matching network 18.

Figure 12:
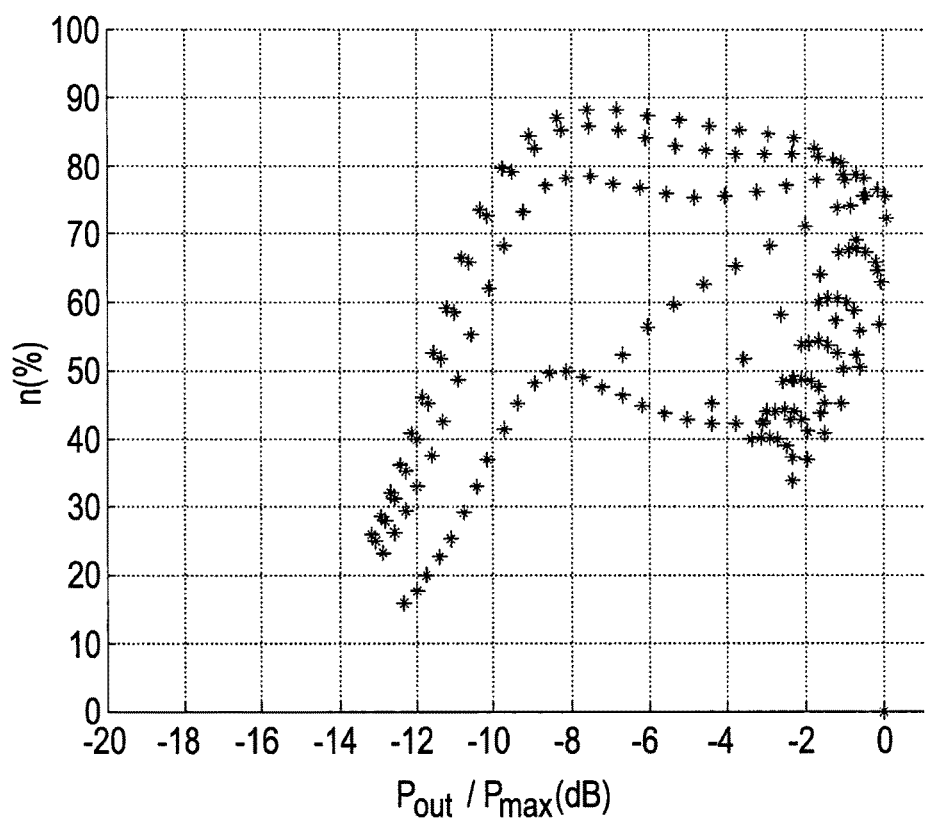
FIGS. 12 and 13 show efficiency results of the circuit shown in FIG. 9 with alternative resistive terminations.
Figure 13:
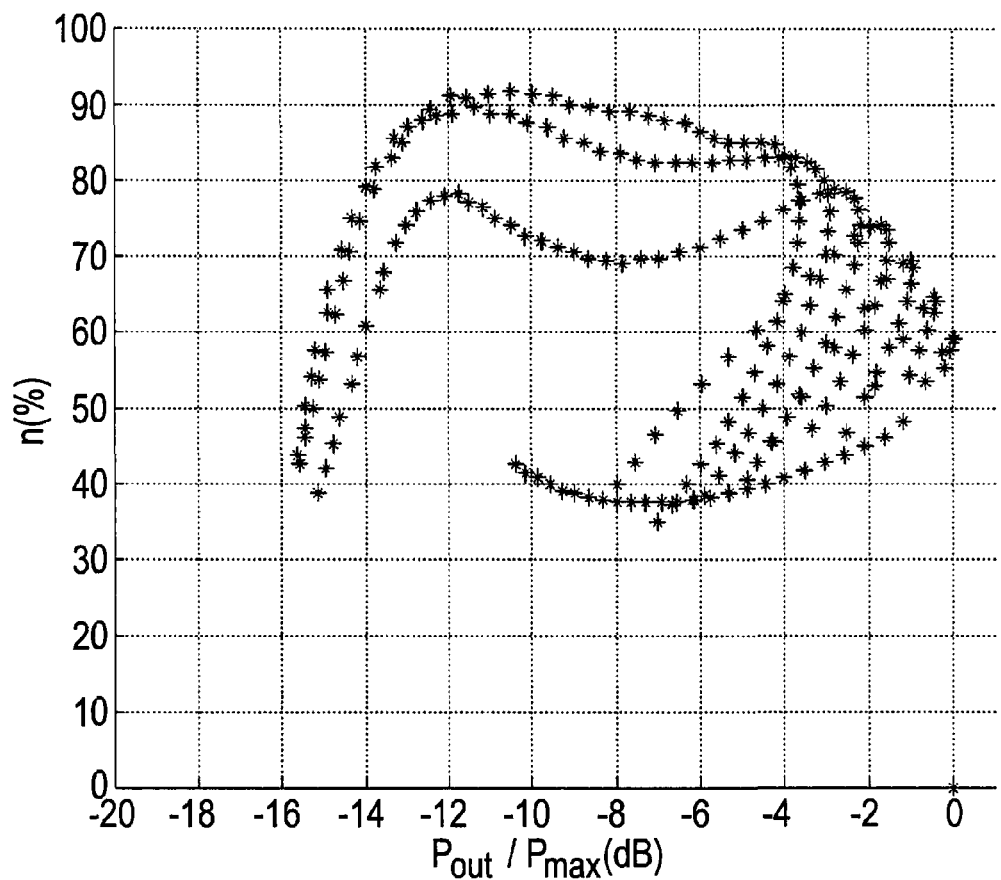

Due to the fact that dynamic control of the bias allows for better PUF and so higher output power, the resistive part of the fundamental output impedance termination can be adjusted in the initial design phase. The benefit of doing so is shown in FIG. 12 and FIG. 13, where the back-off efficiency is maintained, if not enhanced whereas peak output power and high efficiency are maintained throughout the dynamic range of the amplifier. Under Class-B bias such an adjustment would result in lowering the PUF of the amplifier.

FIG. 12 shows efficiency results for Dynamic bias under DLM with reactive ($X_L$=0 to 3) tuning, case 1 ($X_{Cds}/R_{opt}$=2) with alternative resistive termination ($R_L$=0.55).

FIG. 13 shows efficiency results for Dynamic bias under DLM with reactive ($X_L$=0 to 5) tuning, case 2 ($X_{Cds}/R_{opt}$=4) with alternative resistive termination ($R_L$=0.9).

The fact that the efficiency of the amplifier does not degrade for the in-between output power levels (peak power and back-off) allows the amplifier to efficiently amplify signals of different peak-to-average power ratio (PAPR) characteristics without the need for re-configuration or re-optimisation. This compares favourably both to DLM with only reactive tuning but also classical Doherty architectures which exhibit two efficiency peaks with a significant drop in performance in between.

Gate modulation is an inexpensive and efficient technique. Due to the fact that only a small current (a few mA) has to be supplied to the gate of the device (for FET devices this is less than 1% of the delivered power, so it has a negligible effect on the system efficiency), the modulator can be designed to be very efficient. Moreover, the modulator can be implemented using a low-cost off-the-shelf op-amp. Due to this fact, the modulator required for modulating the gate in comparison to drain modulation (i.e. envelope tracking or envelope elimination and restoration) will be much simpler and compact in size. Driving the tuneable elements will also require some power, although small in proportion to the generated power, which lowers the overall efficiency of the system. The power consumed by the driver of the tuneable elements will also be minimised if a single reactive element.

Moreover, even though the value of $V_b$ should be related to the envelope of the input signal, it is also possible that it adapts at much lower rate. This is favourable for wideband signals such as multicarrier WCDMA/LTE or LTE-A signals were the baseband signal may extent up to 100 MHz. Adapting the bias conditions at such speed, although it is not unrealistic, introduces technical challenges.

In an embodiment the rate of modulation of the bias control signal is between 1/10 and 1/4 of the rate of modulation of the envelope. The bias control signal may be obtained by a low pass filter implemented in the digital or the analogue domain.

The control signals for the modulator can be directly supplied by the baseband processing unit or through some simple analogue processing. This signal may not have a linear relationship with the envelope of the signal but is generated by processing in either the digital or analogue domain. Also, the dynamically biased DLM amplifier has the potential for multi-standard/band operation as the re-configurability of the system can be used for optimisation at different frequencies.

Figure 14:
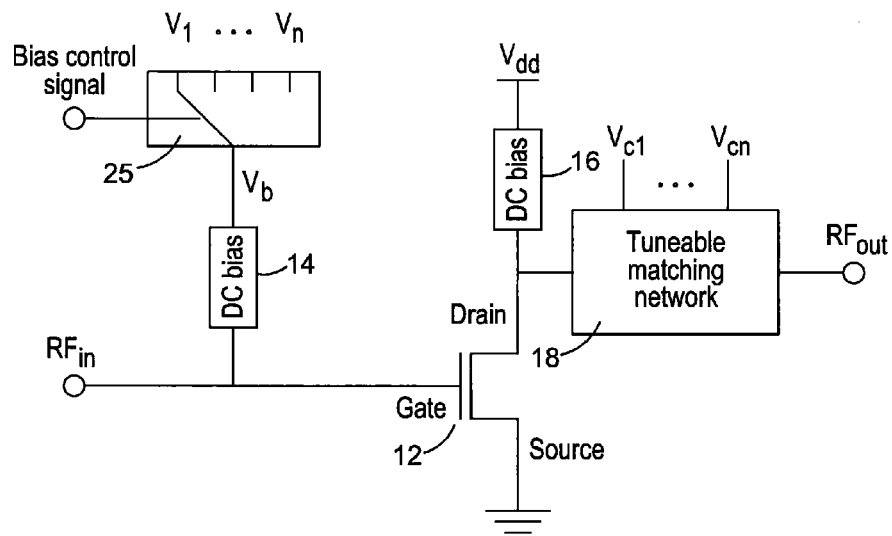
FIG. 14 shows an amplifier circuit according to an embodiment.
Figure 15:
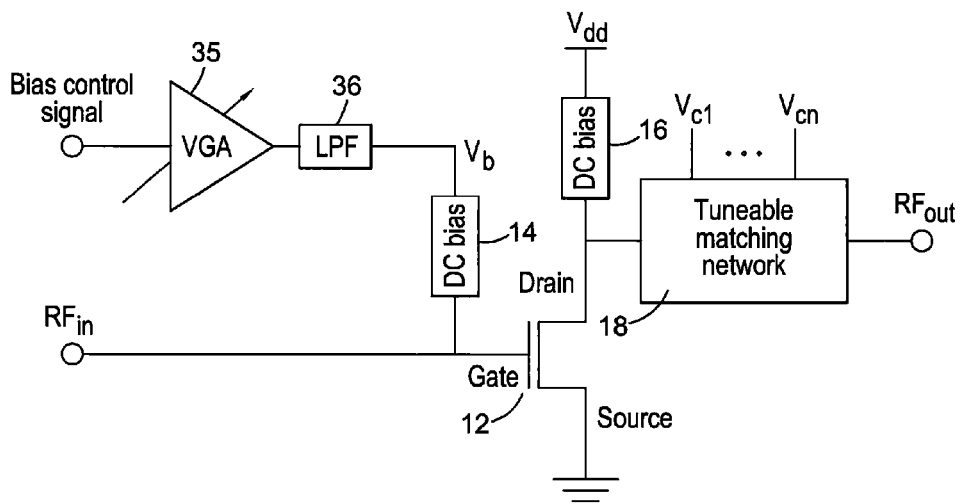
FIG. 15 shows an amplifier circuit according to an embodiment.

Two embodiments for dynamic biasing of a DLM amplifier are shown in FIG. 14 and FIG. 15.

In the embodiment shown in FIG. 14 the bias control signal is provided that controls a switch 25. The switch 25 connects one of a plurality of voltage levels $V_1 \ldots V_n$ as the bias voltage $V_b$. The remaining parts of the amplifier circuit are as described in relation to FIG. 9. In the embodiment shown in FIG. 14 the switch 25 is controlled to pull the gate voltage to the appropriate discrete levels by choosing from a finite pool of bias conditions/voltages. Any number of levels can be implemented. Typical results for a three discrete level biased amplifier are shown in FIG. 10 and FIG. 11.

In embodiments, the input signal's envelope can be amplified, offset, filtered or shaped in any way (using analogue or digital processing) to provide the bias control signal and optimally control the gate bias of the device.

FIG. 15 shows an embodiment in which the bias control signal is amplified with variable gain. The bias control signal is supplied to a variable gain amplifier (VGA) 35. The output of the VGA 35 is passed through a low pass filter 36 to limit the slew rate of the signal.

In an embodiment, the low pass filter 36 is placed before the VGA. In an embodiment the low pass filter is omitted.

The bias control signal may be the envelope signal of the radiofrequency input signal and may be offset by a DC voltage.

The implemented tuneable output matching networks can include low-pass circuits as the ones shown in FIG. 2, FIG. 3 and FIG. 4 as well as high-pass and band-pass equivalents. Moreover, the TMNs can be realised using distributed, discrete components or hybrid approaches which combine both.

While certain embodiments have been described, these embodiments have been presented by way of example only, and are not intended to limit the scope of the inventions. Indeed the novel circuits described herein may be embodied in a variety of other forms; furthermore, various omissions, substitutions and changes in the form of the circuits described herein may be made without departing from the spirit of the inventions. The accompanying claims and their equivalents are intended to cover such forms or modifications as would fall within the scope and spirit of the inventions.

The invention claimed is:

1. An amplifier circuit comprising:
   an amplifying element comprising a transistor and configured to amplify a radiofrequency input signal;
   a bias modulator configured to provide a bias voltage to a gate of the transistor, the bias voltage depending on a bias control signal, wherein the bias modulator comprises a variable gain amplifier configured to amplify an envelope signal of the radiofrequency input signal to adjust a conduction angle of the amplifying element in response to changes in the envelope signal of the radiofrequency input signal, thereby controlling an effective class of operation of the amplifying element; and
   a tuneable matching network configured to use dynamic load modulation to modulate the load to which the output of the amplifying element is applied.

2. The amplifier circuit according to claim 1, wherein the tuneable matching network is configured to modulate a reactance of the load.

3. The amplifier circuit according to claim 1, wherein the tuneable matching network comprises a single reactive element.

4. The amplifier circuit according to claim 1, wherein the bias modulator comprises a switch configured to select the bias voltage from a plurality of discrete voltages.

5. The amplifier circuit according to claim 1, wherein the bias modulator is configured to process the envelope signal of the radiofrequency input signal and control the bias voltage according to the processed envelope signal.

6. The amplifier circuit according to claim 1, wherein the bias modulator further comprises a low pass filter.

7. The amplifier circuit according to claim 1, wherein the bias control signal has a modulation rate of between 1/10 and 1/4 of a modulation rate of the envelope signal of the radiofrequency input signal.

* * * * *